United States Patent
Lam et al.

(10) Patent No.: US 6,426,524 B1
(45) Date of Patent: Jul. 30, 2002

(54) FABRICATING A SQUARE SPACER

(75) Inventors: Chung Hon Lam, Williston; Jed Hickory Rankin, Burlington; Christa Regina Willets, Jericho; Arthur Paul Johnson, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/691,547

(22) Filed: Oct. 18, 2000

Related U.S. Application Data

(62) Division of application No. 09/401,050, filed on Sep. 22, 1999.

(51) Int. Cl.$^7$ .................. H01L 27/108; H01L 29/76
(52) U.S. Cl. .................. 257/296; 257/309; 257/328; 257/329; 257/330; 257/331; 257/332; 438/303; 438/305
(58) Field of Search ................ 257/296, 330, 257/328, 329, 331, 332, 309; 438/305, 303

(56) References Cited

U.S. PATENT DOCUMENTS

| | | | |
|---|---|---|---|
| 5,250,836 A | 10/1993 | Miura et al. | |
| 5,281,557 A | * 1/1994 | Yu | 437/235 |
| 5,372,960 A | * 12/1994 | Davies et al. | 437/44 |
| 5,411,906 A | 5/1995 | Johnson et al. | |
| 5,541,427 A | 7/1996 | Chappell et al. | |
| 5,741,738 A | 4/1998 | Mandelman et al. | |
| 5,776,660 A | 7/1998 | Hakey et al. | |
| 5,789,920 A | 8/1998 | Andricacos et al. | |
| 5,837,612 A | 11/1998 | Ajuria et al. | |
| 5,863,824 A | 1/1999 | Gardner et al. | |
| 5,879,985 A | 3/1999 | Gambino et al. | |
| 5,907,775 A | 5/1999 | Tseng | |
| 5,966,600 A | 10/1999 | Hong | |
| 6,040,210 A | * 3/2000 | Burns et al. | 438/238 |
| 6,077,745 A | * 6/2000 | Burns et al. | 438/270 |
| 6,093,614 A | 7/2000 | Gruening et al. | |
| 6,114,725 A | * 9/2000 | Furukawa et al. | 257/330 |
| 6,118,135 A | 9/2000 | Gonzalez et al. | |
| 6,225,176 B1 | * 5/2001 | Yu | 438/305 |
| 6,242,317 B1 | * 6/2001 | Gardner et al. | 438/400 |
| 6,271,096 B1 | * 8/2001 | Jan et al. | 438/303 |

* cited by examiner

*Primary Examiner*—Caridad Everhart
*Assistant Examiner*—V. Yevsikov
(74) *Attorney, Agent, or Firm*—Schmeiser, Olsen & Watts; William D. Sabo

(57) ABSTRACT

A square spacer and method of fabrication. The method includes forming a spacer film on a mandrel positioned on a substrate, forming an oxide film on the spacer film, performing a first etching, and performing a second etching. The spacer film is formed on perpendicular first and second sides of the mandrel. A first region and a second region of the spacer film are on the first side and the second side of the mandrel, respectively. The spacer film may include a conductive material such as polysilicon or tungsten. The spacer film may alternatively include an insulative material such as silicon dioxide, silicon nitride, or silicon oxynitride. The oxide film is formed such that a first region and a second region of the oxide film are on the first region and the second region of the spacer film, respectively. The oxide film may include silicon dioxide. The first etching etches away the first region of the oxide film and a portion of the first region of the spacer film. The second etching forms the square spacer by etching away the remaining first region of the spacer film and also a portion of the second region of the oxide film, after which a top surface of the second region of the spacer film and a top surface of the second region of the oxide film are at about the same height above the substrate. The first and second etching may be accomplished by reactive ion etching or chemical downstream etching.

21 Claims, 7 Drawing Sheets

FABRICATING A SQUARE SPACER

This application is a divisional of Ser. No. 09/401,050, filed on Sep. 22, 1999.

BACKGROUND OF THE INVENTION

1. Technical Field

The present invention relates to a square spacer and an associated method of fabrication.

2. Related Art

Sidewall features known as "spacers" are used in electronic packages and are formed in abutment with such electronic features as gates, conductive lines, transistors, and inherent topography. Such a feature is characterized by a vertical wall against which a spacer can be formed. In particular, a stack of spacers are commonly formed as arrayed in a horizontal direction with a first spacer of the stack abutting the vertical wall of the feature. Each spacer in the stack is parallel to the vertical wall and more distant from the vertical wall than the immediately preceding spacer. An array of 1 to 3 spacers in such a stack is common. With current methods of spacer formation, a spacer formed in abutment with a wall does not have a horizontal top surface but rather has a top surface with a rounded corner on that portion of the top surface that is most distant from the wall. The rounded corner results from a plasma etching process that utilizes isotropic distributions of particles, such as ionized plasma particles, for etching a material from which the spacer is formed, as well as from the topography of the material to be etched. Unfortunately, the rounded corner of a given spacer reduces the vertical height of the side of the spacer that includes the rounded corner. As a result, less vertical height is available for the next spacer in the stack in the horizontal direction away from the feature; i.e., the height of successive spacers in the stack are reduced. For example, if the first spacer (i.e., the spacer abutting the feature) in the stack is 2000 Å high, then the second and third spacers in the stack may be limited to vertical heights of only 1400 Å and 1000 Å, respectively. Even worse, the width of successive spacers in the stack are also reduced because fabrication methods generally limit a spacer width to be no greater than about two-thirds of the spacer height. Thus, current fabrication methods limit both successive vertical heights and the total cumulative width of a stack of spacers that abut a feature of the electronic package. A particular disadvantage associated with the limitation on successive vertical height is that insulative spacers between conductive structure on the electronic package may have insufficient height or width to prevent undesired diffusion of conductive material from one conductive structure to another, resulting in shorting over the spacer.

A method is needed for fabricating a square spacer having a flat horizontal top surface.

SUMMARY OF THE INVENTION

The present invention provides a method for forming a square spacer, comprising the steps of:

providing a mandrel;

forming a first layer over two intersecting sides of the mandrel, said first layer including a first material;

forming a second layer over the first layer, said second layer including a second material; and forming the square spacer by:

etching away a portion of the first layer; and etching away a portion of the second layer.

The present invention provides an electronic structure comprising a square spacer, said square spacer having:

a mandrel on a surface of a substrate;

a first region of a spacer material abutting the mandrel and on the surface of the substrate;

a second region of the spacer material abutting a portion of the first region and on the substrate; and a region of oxide material abutting a remaining portion of the first region and on the second region, wherein a height of the oxide region above the surface of the substrate is about equal to a height of the first region above the surface of the substrate.

The present invention has the advantage of providing a square spacer with a horizontal top surface that enables a stack of spacers to have substantially greater successive vertical heights and a total cumulative width for a stack of spacers than is the case with a conventional stack of spacers having rounded corners.

The present invention has the advantage of being able to form a stack of insulative spacers that is high and wide enough to prevent undesired diffusion of conductive material from a conductive structure on one side of the stack to another conductive structure on the opposite side of the stack.

The horizontal top surface of a spacer of the present invention has the advantage of making it easier to lithographically align a second mask over a first mask than with a rounded surface, because a rounded surface has less visual contrast with surrounding features, and requires a larger focal window, than does a square surface; i.e., it is easier to recognize where an end of a spacer is if the spacer has a sharply defined square corner rather than a rounded surface.

The horizontal top surface of a conductive spacer of the present invention has the advantage of making it easier to form an electrical contact on top of a conductive spacer than with a rounded surface, because a contact can land only on a flat surface and not on a sloped surface.

The horizontal top surface of a square polysilicon spacer of the present invention has the advantage of allowing formation of a silicide over the square polysilicon spacer.

DETAILED DESCRIPTION OF THE INVENTION

Figure 1:
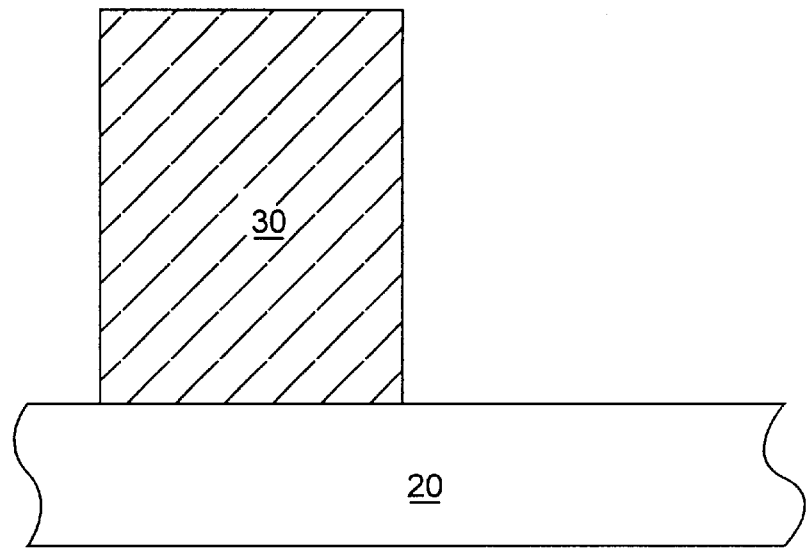
FIG. 1 depicts a cross-sectional view of an electronic structure that includes a mandrel on a substrate, in accordance with the preferred embodiment of the present invention.

FIG. 1 illustrates an electronic structure having a mandrel 30 on a substrate 20, in accordance with the preferred embodiment of the present invention. The mandrel 30 represents a feature next to which an abutting square spacer will be formed. Possible features represented by the mandrel 30 include, inter alia, conductive spacers and sidewall image transfer devices.

Figure 2:
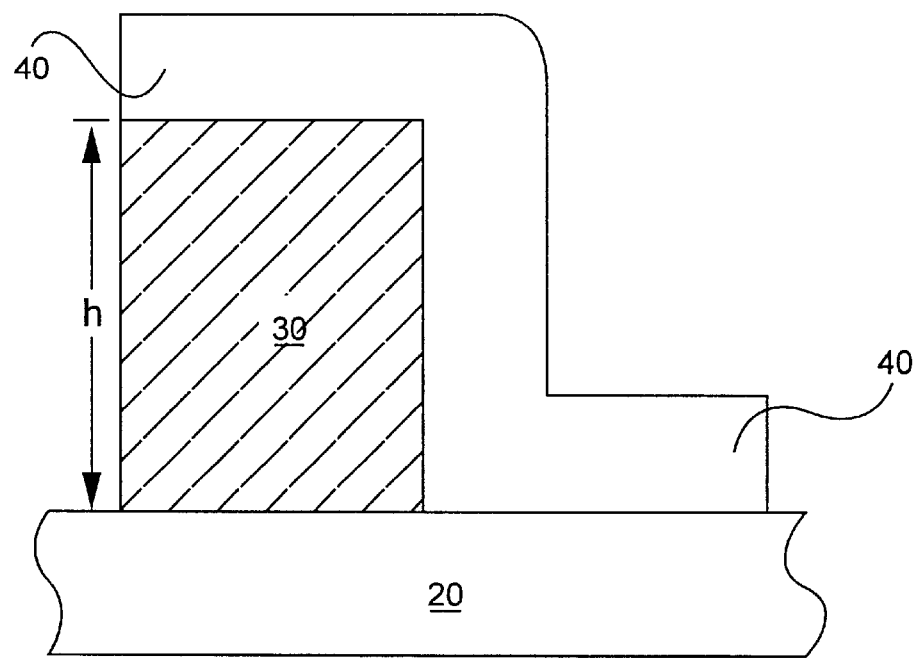
FIG. 2 depicts FIG. 1 after a spacer film has been formed over the mandrel.

FIG. 2 illustrates FIG. 1 after a continuous spacer film 40 has been formed over the mandrel 30. The spacer film 40 may include a conductive material such as polysilicon or tungsten. Alternatively, the spacer film 40 may include a insulative material such as silicon dioxide, silicon nitride, or silicon oxynitride. The spacer film 40 may be formed by any process known to one of ordinary skill in the art. For example, a polysilicon film may be formed by chemical vapor deposition (CVD) using a mixture of a silane, hydrogen, and nitrogen at about 700° C. The spacer film 40 may have any thickness that may be formed by methods known in the art, including, inter alia, a thickness of about two-thirds a height (h) of the mandrel 30.

Figure 3:
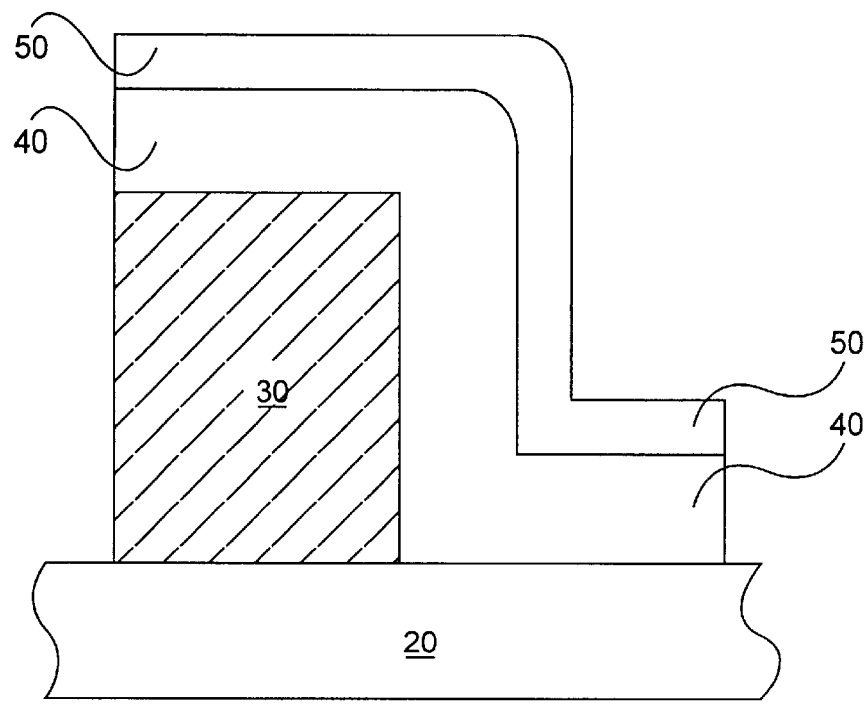
FIG. 3 depicts FIG. 2 after an oxide film has been formed over the spacer film.

FIG. 3 illustrates FIG. 2 after a continuous oxide film 50 has been formed over the spacer film 40. The oxide film 50 may include any material that may be chemically etched at a different rate than that of the material of the spacer film 40; e.g., an oxide such as silicon dioxide. The oxide film 50 may be formed by any process known to one of ordinary skill in the art. For example, a silicon dioxide film may be formed by CVD using a mixture of a silane, hydrogen, and tetraethyloxosilane at about 700° C. The oxide film 50 should have a minimum and maximum thickness that is smaller than a thickness of the spacer film 40, preferably between about one tenth and about one half of a thickness of the spacer film 40.

Figure 4:
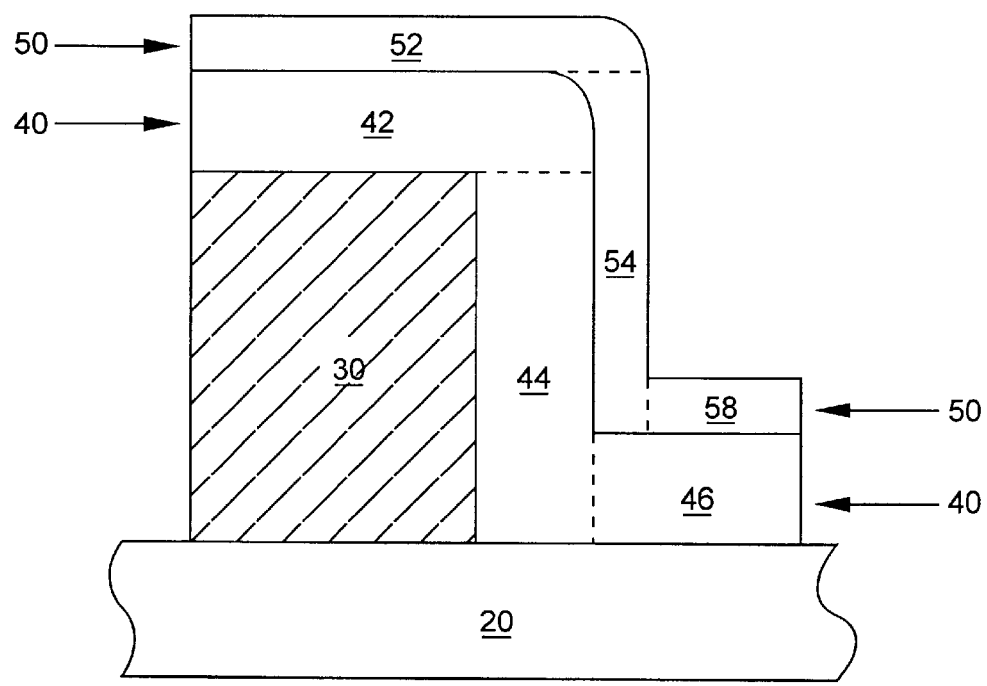
FIG. 4 depicts FIG. 3, showing the spacer film and the oxide film each divided into regions.

FIG. 4 depicts FIG. 3, showing the spacer film 40 and the oxide film 50 each divided into regions. The spacer film 40 includes a first spacer region 42, a second spacer region 44, and a third spacer region 46. The oxide film 50 includes a first oxide region 52, a second oxide region 54, and a third oxide region 58. Both the spacer film 40 and the oxide film 50 are preferentially, but not necessarily, conformal. A film is conformal if the thicknesses of regions having different spatial orientations are approximately equal to one another. For example, the spacer film 40 is conformal if a thickness of the first spacer region 42, a thickness of the second spacer region 44, and a thickness of the third spacer region 46 are approximately equal to one another.

Figure 5:
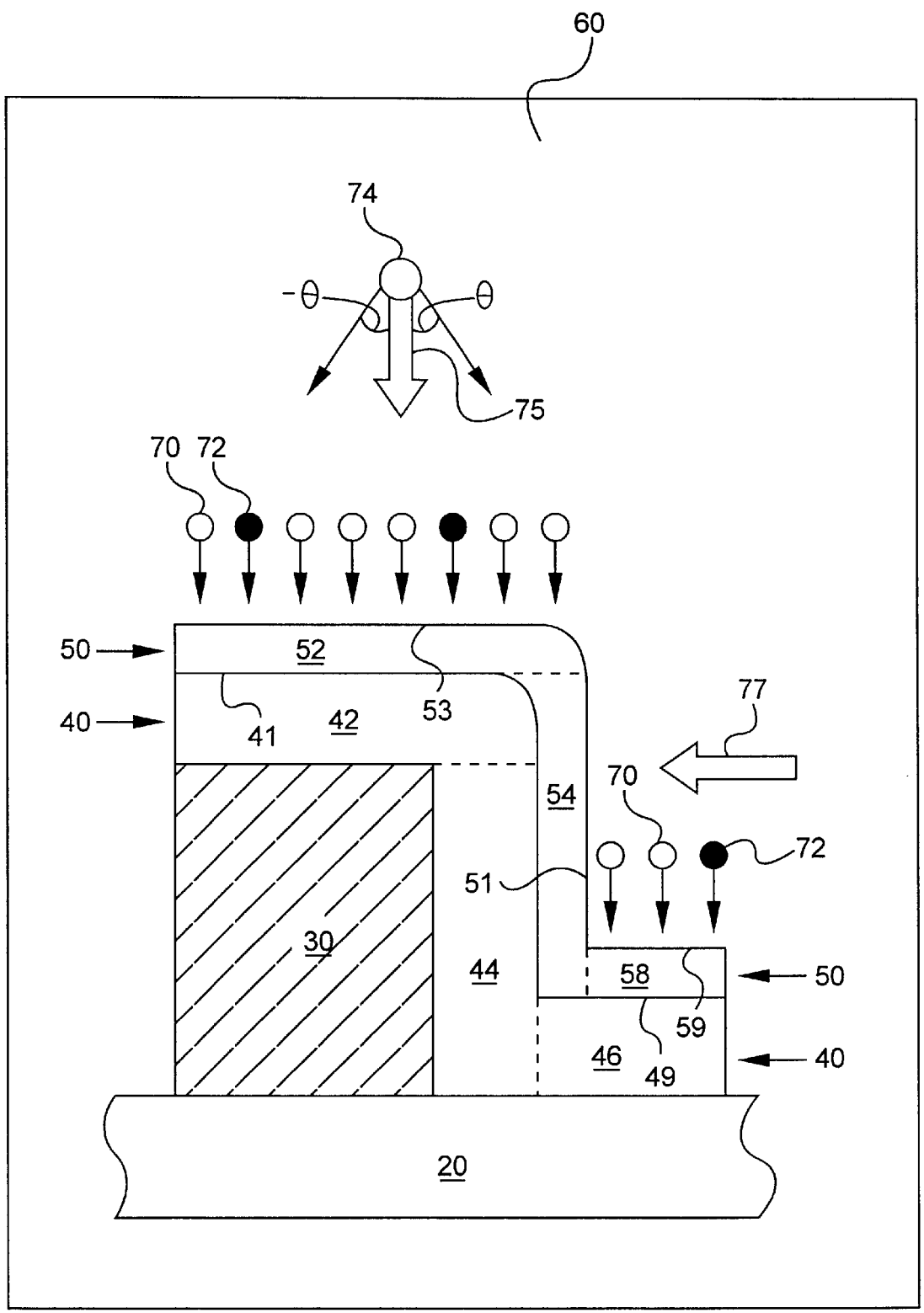
FIG. 5 depicts the electronic structure of FIG. 4 placed in a plasma chamber with anisotropically directed particles etching the electronic structure in a first etching.

FIG. 5 depicts the electronic structure of FIG. 4 placed in a plasma chamber 60 in order to perform a first etching of the electronic structure. The first etching is accomplished by particles which are generated within the plasma chamber 60 and anisotropically directed onto the oxide film 50. As shown in FIG. 5, the particles of two types: a first particle 70 that interacts primarily with the oxide film 50, and a second particle 72 that interacts primarily with the spacer film 40. The first particle 70 may include, inter alia, fluorine. The second particle 72 may include, inter alia, chlorine. Specific chemical choices of the first particle 70 and the second particle 72 depend on a material composition of the oxide film 50 and the spacer film 40, respectively. For the preceding particle examples, chlorine and fluorine collectively etch polysilicon and silicon dioxide, respectively, when the spacer film 40 includes polysilicon and the oxide film 50 includes silicon dioxide. In the first etching, the first particle 70 and the second particle 72 serve to etch away the first oxide region 52, a top portion of the first spacer region 42, a top portion of the second oxide region 54, the third oxide region 58, and a top portion of the third spacer region 46. The first etching results from chemical reactions between the etchant (the first particle 70 and the second particle 72) and chemical compounds in the oxide film 50 and the spacer film 40.

The relevant characteristics of the first particle 70 and of the second particle 72 for accomplishing the first etching depend on the particular plasma etching process that is utilized with the plasma chamber 60. Plasma etching processes that may be utilized include reactive ion etching (RIE) and chemical downstream etching (CDE). RIE and CDE processes, together with their practical utilization, are generally known to one of ordinary skill in the art.

With RIE, which is the preferred plasma etching process for the present invention, both the first particle 70 and the second particle 72 are negatively charged in an ionized state as they respectively etch the oxide film 50 and the spacer film 40. The RIE process starts with source chemicals in the plasma chamber 60 and generates a low-pressure plasma gas by ionizing the source chemicals at a temperature between about 200° C. and about 500° C. to generate the first particle 70 and the second particle 72 in ionic form. The pressure within the plasma chamber 60 is preferably about 50 mtorr and should generally be between about 10 mtorr and about 200 mtorr. For the first particle 70 of ionic fluorine, the source chemical may be, inter alia, $F_2$, $C_2F_6$, $CHF_3$, $CH_2F_2$, or $CH_3F$. For the second particle 72 of ionic chlorine, the source chemical may be, inter alia, HCl or $Cl_2$. An electric field within the plasma chamber 60, typically supplied by an external power supply, separates the negatively charged first particle 70, as well as the negatively charged second particle 72, from positively charged ionized particles in the plasma. The electric field, together with a magnetic field within the plasma chamber 60, energizes first particle 70 and the second particle 72. Additionally, the electric field is distributed and aligned so as to orient a motion of the first particle 70 and the second particle 72 approximately in a direction 75 toward the electronic structure to be etched.

With CDE, both the first particle 70 and the second particle 72 are in an atomic state, which is electrically neutral, as they respectively etch the oxide film 50 and the spacer film 40. The CDE process starts with source chemicals in the plasma chamber 60 and ionizes the source chemicals at low pressure and at a temperature between about 200° C. and about 600° C. to generate a first ionic particle and a second ionic particle that will eventually be transformed into the first particle 70 and the second particle 72, respectively, in neutral atomic form. The pressure within the plasma chamber 60 may be, inter alia, about 10 mtorr and should generally be between about 5 mtorr and about 200 mtorr. For the first particle 70 of ionic fluorine, the source chemical may be, inter alia, $F_2$, $C_2F_6$, $CHF_3$, $CH_2F_2$, or $CH_3F$. For the second particle 72 of ionic chlorine, the source chemical may be, inter alia, HCl or $Cl_2$. Specific chemical choices of first particle 70 and the second particle 72 depend on the chemical composition of the material that the particles 70 and 72 interact with, namely the chemical composition of the material in the oxide film 50 and the spacer film 40, respectively. With CDE, an electric field within the plasma chamber 60, typically supplied by an external power supply, separates the negatively charged first ionic particle, as well as the negatively charged second ionic particle, from positively charged ionized particles in the plasma.

There is a fundamental difference between the RIE electric field and the CDE electric field. The RIE electric field interacts with the ionic species of the plasma at a close distance to the electronic structure, such as within several inches of the first oxide region 52 and the third oxide region 58. In contrast, the CDE electric field interacts with the ionic species of the plasma at a relatively greater distance to the electronic structure, such as between about three and about ten feet of the first oxide region 52 and the third oxide region 58. With CDE having a relatively large distance between the ionic species (the first ionic particle and the second ionic particle) from the electronic structure, moving ionic species are likely to collide with other gaseous particles in the plasma chamber 60. As a result of the likely collisions, the ionic species lose their excess electrons and are transformed to the first particle 70 and the second particle 72 into the form of electrically neutral atoms rather into the form of ions. Next, a hydraulic circuit comprising an external pump generates a pressure gradient that directs the first particle 70 and the second particle 72 in a direction 75 toward the electronic structure to be etched.

Another difference between RIE and CDE relates to the angular orientation of the first particle 70 and the second particle 72. While the first particle 70 and the second particle 72 are shown in FIG. 5 to be moving in the direction 75 perpendicularly to the first oxide region 52, the first particle 70 and the second particle 72 actually move in a direction $\theta$ with respect to the direction 75 as shown for the particle 74 in FIG. 5. The particle 74 represents either the first particle 70 or the second particle 72 and serves to define positive and negative values of $\theta$ for particle motions to the right and left, respectively, of the direction 75. Due to magnetic and other interactions that accompany electric fields in a plasma, $\theta$ is not precisely zero degrees for every first particle 70 and every second particle 72, but is governed by a probability distribution that is peaked at about zero degrees and is typically truncated at about 15 degrees.

Figure 6:
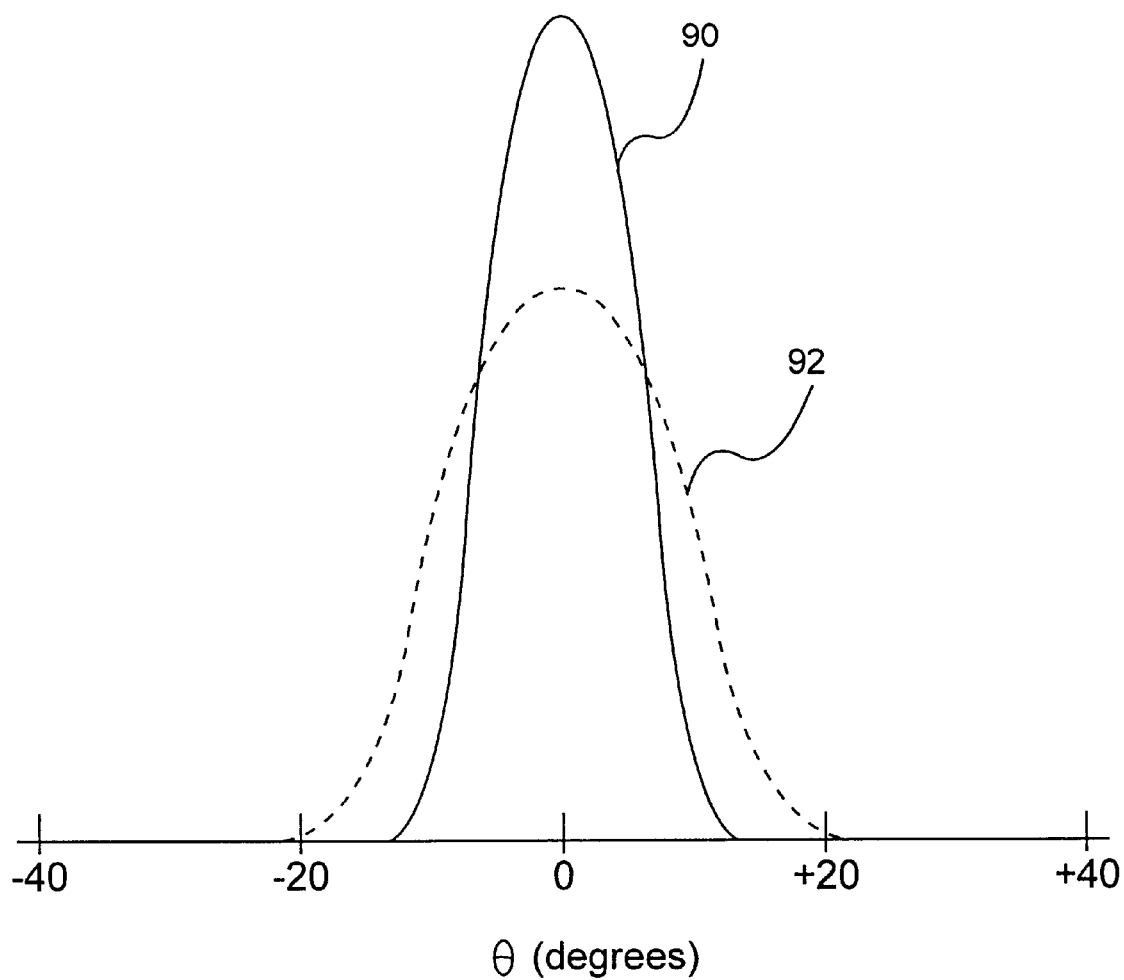
FIG. 6 depicts angular distributions for the particles of FIG. 5, illustrating a difference between reactive ion etching (RIE) and chemical downstream etching (CDE).

FIG. 6 illustrates representative RIE and CDE angular distribution 90 and 92, respectively. Because the RIE angular distribution 90 is sharply peaked about zero degrees for $\theta$, the first particle 70 etches away the first oxide region 52 and the third oxide region 58, but does not etch away the second oxide region 54 in the direction 77 (see FIG. 5). The CDE angular distribution 92 in FIG. 6 is broader with a higher standard deviation than that of the RIE angular distribution 90, because a pressure gradient is less effective in controlling a direction of particle motion than is an electric field in controlling a direction of motion of charged particles. Note that the angular distributions 90 and 92 in FIG. 6 are representative estimates for qualitatively contrasting RIE and CDE angular distributions. Actual RIE and CDE angular distributions may differ quantitatively from those in FIG. 6.

With less deviation from verticality (i.e., from $\theta$ equal to zero degrees) as explained above, along with differences in chemical reactions involving ions as opposed to neutral atoms, the RIE method has less of a tendency to laterally etch the second oxide region 54 in the direction 77 (see FIG. 5) than does the CDE method. Thus, the RIE method is potentially capable of forming a square spacer to a higher degree of perfection than is the CDE method, because forming a square spacer requires preserving a lateral integrity of the second oxide region 54. Another advantage of RIE over CDE is that RIE etches more powerfully than CDE, because the chemical reactions between the etchant (the first particle 70 and the second particle 72) and the regions to be fully or partially etched (regions 52, 42, 54, 58, and 46) are more intense with the negatively charged particles of RIE than with the atomic particles of CDE. On the other hand, the CDE method affords easier control over the etching process because the CDE method is less dependant on a coupling of operational parameters (e.g., temperature, gas pressure, electric field strength, concentration of the first particle 70, concentration of the second particle 72, etc.) than is the RIE method. In balancing the preceding considerations, the RIE method preferred over the CDE method, particularly because of its greater degree of directionality with respect to $\theta$ and consequent selectivity of etching in the direction 75 in FIG. 5.

As a consequence of the directional orientation discussed supra for FIG. 5 in relation to both the RIE method and the CDE method, the first particle 70 and the second particle 72 move in a direction that is approximately parallel to the top surface 51 of the second oxide layer 54. Accordingly, the first particle 70 and the second particle 72 do not materially etch away the second oxide layer 54 in the direction 77 as fast as in direction 75. This anisotropic etching property of the present invention, coupled with use of a suitable etch rate ratio $R_1/R_2$ as defined and discussed infra in conjunction with FIG. 9, enables a square spacer to be formed with the preferred embodiment. Note that as the width of the RIE anisotropic angular distribution 90 of FIG. 6 becomes arbitrarily small, the RIE anisotropic angular distribution 90 becomes unidirectional corresponding to values of $\theta$ arbitrarily close to zero degrees.

Figure 7:
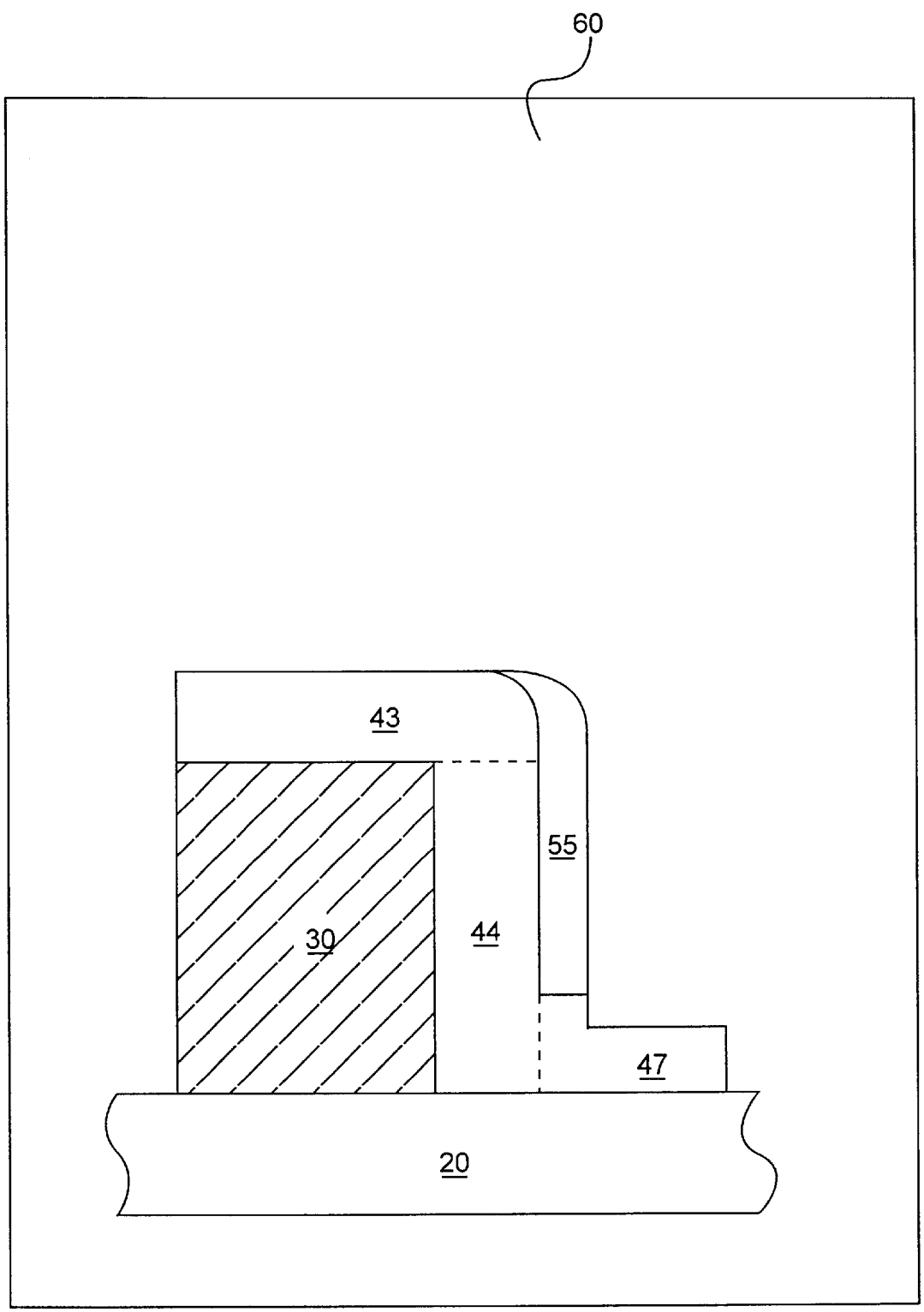
FIG. 7 depicts a remaining electronic structure in the plasma chamber, resulting from the first etching of FIG. 5.

FIG. 7 illustrates the electronic structure in the plasma chamber 60, following the first etching illustrated in FIG. 5 and described supra. The first spacer region 43 of FIG. 7 is what remains of the first spacer region 42 of FIG. 5 following the first etching. The second oxide region 55 of FIG. 7 is what remains of the second oxide region 54 of FIG. 5 following the first etching. The third spacer region 47 of FIG. 7 is what remains of the third spacer region 46 of FIG. 5 following the first etching.

Figure 8:
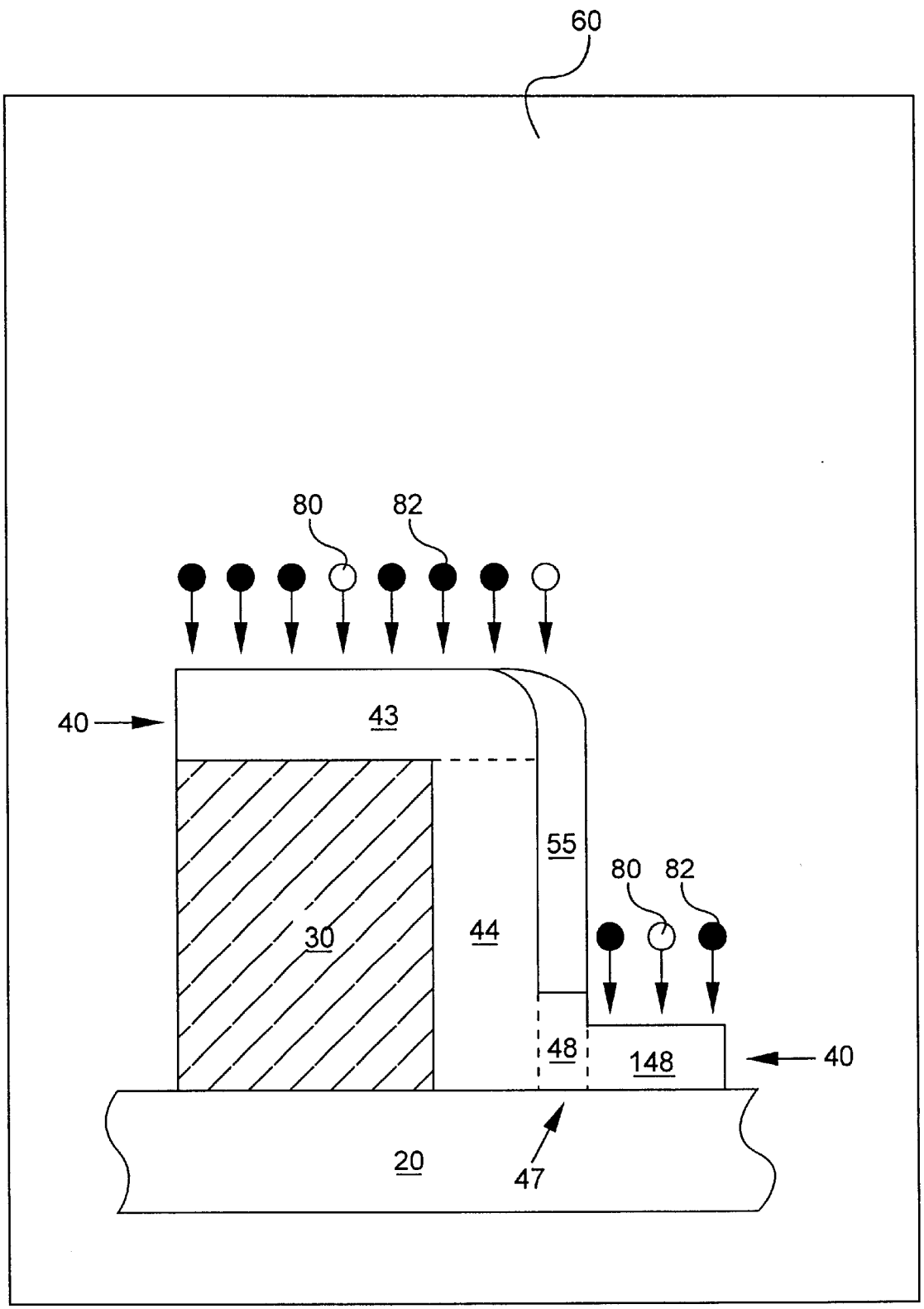
FIG. 8 depicts FIG. 7 with anisotropically directed particles etching the remaining electronic structure in a second etching in the plasma chamber.

In FIG. 8, a second etching utilizes particles generated within the plasma chamber 60 to anisotropically etch the electronic structure of FIG. 7 to complete formation of the square spacer of the present invention. As shown in FIG. 8, the particles are two types: a first particle 80 that interacts primarily with the second oxide region 55, and a second particle 82 that interacts primarily with the first spacer region 43, the second spacer region 44, and the third spacer region 47 (see FIG. 7). As shown in FIG. 8, the third spacer region 47 of FIG. 7 includes an etchable portion 148 and a remaining portion 48. The first particle 80 may be the same as the first particle 70 of the first etching. The second particle 82 may be the same as the first particle 72 of the first etching. The first particle 80 may include, inter alia, fluorine. The second particle 82 may include, inter alia, chlorine. The second etching results from chemical reactions between the etchant (the first particle 80 and the second particle 82) and chemical compounds in the second oxide region 55 and the spacer film 40. As with the first etching described supra, the second etching may be accomplished, inter alia, by the RIE method or the CDE method. The characteristics of the RIE and CDE methods for use with the second etching are the same as was described supra for the first etching. The second etching in FIG. 8 etches away the first spacer region 43, a top portion of the second spacer region 44, a top portion of the second oxide region 55, and the etchable portion 148 of the third spacer region 47.

Figure 9:
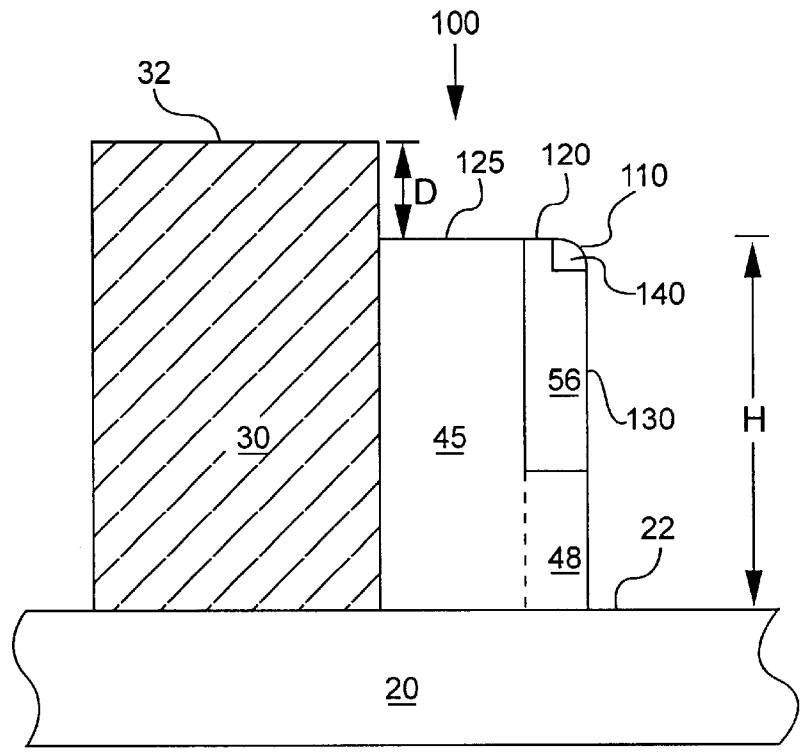
FIG. 9 depicts the electronic structure including a square spacer having a square corner, resulting from the second etching of FIG. 8.
Figure 10:
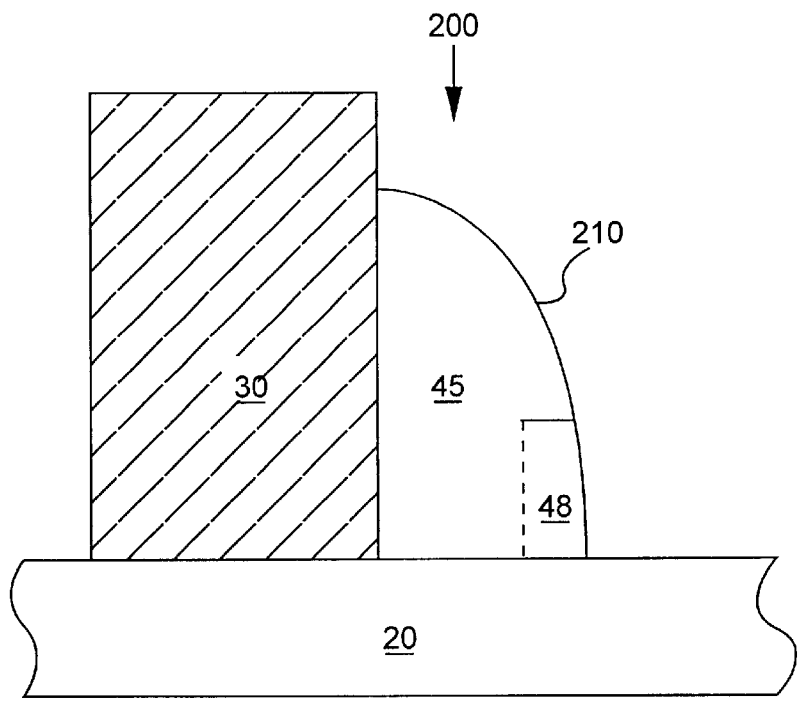
FIG. 10 depicts FIG. 9 with the square corner eliminated so as to show a rounded spacer rather than a square spacer.

FIG. 9 illustrates the square spacer 100 that results from the second etching of FIG. 8. The square spacer 100 includes a remaining second spacer region 45 which is the main body of the spacer 100, a remaining second oxide region 56, and the remaining third spacer region 48. What makes the square spacer 100 "square" is that the square spacer 100 has a geometric square shape. This requires that a top surface 120 of the second oxide region 56 and a lateral surface 130 of the second oxide region 56 intersect at a square corner point 110 to form an angle 140 of about 90 degrees. Note that in practice the square corner point 110 has a slight rounding rather than a sharp point, as shown in FIG. 9. In contrast, FIG. 10 illustrates a rounded spacer 200, such as may be fabricated with existing methods without benefit of the present invention, in which the square corner point 110 of FIG. 9 has been eliminated and a curved surface 210 defines an outer boundary of the rounded spacer 200.

For the square spacer 100 of FIG. 9 to be geometrically square, a top surface 125 of the second oxide region 45 and the top surface 120 of the second oxide region 56 should be coplanar and thus at about a same height H above a top surface 22 of the substrate 20. To achieve the same height H for both top surfaces 125 and 120, the period T of the second etching and the etch rate ratio $R_1/R_2$ must be suitably adjusted, wherein $R_1$ is the etch rate in Å/sec of the first spacer region 43 and the second spacer region 44, and $R_2$ is the etch rate in Å/sec of the second oxide region 55 (see FIG. 8). $R_2$ is generally unequal to $R_1$. Returning to FIG. 8, the suitable etch rate ratio $R_1/R_2$ depends on the thicknesses to be etched away of: the first spacer region 43, the top portion of the second spacer region 44, and the top portion of the second oxide region 55. Achieving the suitable values of T and the etch rate ratio $R_1/R_2$ requires adjustment of parameters of the plasma etching process. For both the RIE and CDE processes, the pertinent parameters to be adjusted include temperature, pressure, flow rates, power, and magnetic field strength. The adjustments may be made without undue experimentation by a person of ordinary skill in the art of plasma etching.

FIG. 9 shows a separation distance D between a top surface 32 of the mandrel and the top surfaces 125 and 120 of the second spacer region 45 and the second oxide region 56, respectively. The magnitude of D is numerically equal to a thickness of the top portion of the second spacer region 44 (see FIG. 8) that was etched away during the second etching. D is a function of T and $R_1/R_2$ and is therefore controllable. In particular, T and $R_1/R_2$ may be adjusted such that D is arbitrarily small in which case the top surfaces 125 and 120 can be made to be about coplanar with the top surface 32 of the mandrel.

The conductive or insulative functional components within the square spacer 100 include the second spacer region 45 and the third spacer region 48. The second oxide region 56 serves to provide structural integrity and protect against contamination. For example with a polysilicon spacer, if the second oxide region 56 were made of silicon dioxide, the silicon dioxide could be removed by wet chemical attack with a hydrochloric acid solution without affecting the polysilicon in the second spacer region 45 and the third spacer region 48. Such elimination of the second oxide region 56 would leave the spacer 100 in an "L" shape, rendering the spacer 100 susceptible to debris collection.

Although the preferred embodiment of the present invention described herein utilizes anisotropic etching to form a square spacer, isotropic etching is nevertheless within the scope of the present invention. Referring to FIG. 5 and noting that the preferred embodiment prevents etching of the second oxide layer 54 in the direction 77, it is clear that any method of preventing an etchant from contacting the top surface 51 of the second oxide layer 54 will also prevent etching of the second oxide layer 54 in the direction 77. For example, a barrier such as a physical, chemical, electrical, or magnetic barrier that may be formed by a person of ordinary skill in the art, may be used to prevent an etchant from contacting the top surface 51 of the second oxide layer 54, which would permit isotropic etching of the first oxide region 52, the first spacer region 42, and an upper portion of the second oxide region 54, for forming the square spacer.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure comprising a square spacer, said square spacer having:
   a mandrel on a surface of a substrate;
   a first region of a spacer material abutting the mandrel and on the surface of the substrate;
   a second region of the spacer material abutting a portion of the first region and on the substrate; and
   a region of oxide material abutting a remaining portion of the first region and on the second region, wherein a height of a top surface of the oxide region above the surface of the substrate is substantially constant with respect to spatial position on the top surface, and wherein the height of the top surface is about equal to a height of the first region above the surface of the substrate.

2. The structure of claim 1, wherein the spacer material includes a conductive material.

3. The structure of claim 2, wherein the conductive material is selected from the group consisting of polysilicon and tungsten.

4. The structure of claim 1, wherein the spacer material includes a insulative material.

5. The structure of claim 4, wherein the insulative material is selected from the group consisting of silicon dioxide, silicon nitride, and silicon oxynitride.

6. The structure of claim 1, wherein the oxide material includes silicon dioxide.

7. An electronic structure comprising a square spacer, said square spacer having:
   a mandrel on a surface of a substrate;
   a first region of a spacer material abutting the mandrel and on the surface of the substrate;
   a second region of the spacer material abutting a portion of the first region and on the substrate; and
   a region of oxide material abutting a remaining portion of the first region and on the second region, wherein a height of the oxide region above the surface of the substrate is about equal to a height of the first region above the surface of the substrate, and wherein a height of the mandrel above the surface of the substrate is about equal to the height of the oxide region above the surface of the substrate.

8. An electronic structure comprising a square spacer, said square spacer having:
   a mandrel on a surface of a substrate;
   a first region of a spacer material abutting the mandrel and on the surface of the substrate;
   a second region of the spacer material abutting a portion of the first region and on the substrate; and an oxide region abutting a remaining portion of the first region and on the second region, wherein the oxide region includes an oxide material, wherein a top surface of the first region is coplanar with a top surface of the oxide region, wherein the top surface of the first region is the surface of the first region that is farthest from the substrate, and wherein the top surface of the oxide region is the surface of the oxide region that is farthest from the substrate.

9. The structure of claim 8, wherein the top surface of the first region is coplanar with a top surface of the mandrel, and wherein the top surface of the mandrel is the surface of the mandrel that is farthest from the substrate.

10. The structure of claim 8, wherein the top surface of the mandrel is more distant from the substrate than is the top surface of the first region, and wherein the top surface of the mandrel is the surface of the mandrel that is farthest from the substrate.

11. The structure of claim 8, wherein the s pacer material includes a conductive material.

12. The structure of claim 11, wherein the conductive material is selected from the group consisting of polysilicon and tungsten.

13. The structure of claim 8, wherein the spacer material includes a insulative material.

14. The structure of claim 13, wherein the insulative material is selected from the group consisting of silicon dioxide, silicon nitride, and silicon oxynitride.

15. The structure of claim 8, wherein the oxide material includes silicon dioxide.

16. An electronic structure comprising a square spacer, said square spacer having:
 a mandrel on a surface of a substrate;
 a first region of a spacer material abutting the mandrel and on the surface of the substrate;
 a second region of the spacer material abutting a portion of the first region and on the substrate; and
 an oxide region abutting a remaining portion of the first region and on the second region, wherein the oxide region includes an oxide material, wherein a first surface of the oxide region and a second surface of the oxide region intersect at a corner point of the oxide region to form an angle of about 90 degrees, and wherein the corner point does not touch the first region, and wherein the corner point does not touch the second region.

17. The structure of claim 16, wherein the spacer material includes a conductive material.

18. The structure of claim 17, wherein the conductive material is selected from the group consisting of polysilicon and tungsten.

19. The structure of claim 16, wherein the spacer material includes a insulative material.

20. The structure of claim 19, wherein the insulative material is selected from the group consisting of silicon dioxide, silicon nitride, and silicon oxynitride.

21. The structure of claim 16, wherein the oxide material includes silicon dioxide.

* * * * *